United States Patent [19]

Takahashi et al.

[11] Patent Number: 4,914,359
[45] Date of Patent: Apr. 3, 1990

[54] DEFLECTING VOLTAGE GENERATING CIRCUIT

[75] Inventors: Akira Takahashi; Akira Takeshima; Musubu Koishi, all of Shizuoka, Japan

[73] Assignee: Hamamatsu Photonics Kabushiki Kaisha, Shizuoka, Japan

[21] Appl. No.: 291,821

[22] Filed: Dec. 29, 1988

[51] Int. Cl.$^4$ .............................................. H01J 29/74
[52] U.S. Cl. ...................................... 315/410; 315/370
[58] Field of Search .......................... 315/410, 408, 370

[56] References Cited

U.S. PATENT DOCUMENTS

| | | | |
|---|---|---|---|
| 4,645,918 | 2/1987 | Tsuchiya et al. | 250/213 VT |
| 4,682,086 | 7/1987 | Mallinson et al. | 315/371 |
| 4,694,154 | 9/1987 | Tsuchiya et al. | 250/213 VT |

FOREIGN PATENT DOCUMENTS

| | | |
|---|---|---|
| 0108340 | 5/1984 | European Pat. Off. . |
| 1177717 | 1/1970 | United Kingdom . |

OTHER PUBLICATIONS

Cunin et al., "Sweep Devices for Picosecond Image—Converter Streak Cameras", Rev. Sci. Instrum., vol. 51, No. 1, Jan. 1980, pp. 103–110.

Moll et al., "P-N Junction Charge Storage Diodes", Proceedings of the IRE, Jan. 1962, pp. 43–53.

Hewlett Packard, Application Note 918, "Pulse and Wave Form Generation with Step Recovery Diodes", pp. 1–23.

Primary Examiner—Theodore M. Blum
Attorney, Agent, or Firm—Finnegan, Henderson, Farabow, Garrett and Dunner

[57] ABSTRACT

A deflecting voltage generating circuit comprising a voltage generating unit for generating a deflecting voltage and a voltage correcting unit for correcting the deflecting voltage generated by the voltage generating unit and applying the deflecting voltage thus corrected to deflecting electrodes of a streak tube, a sampling streak tube or the like. The voltage correcting unit is so designed that for a predetermined period from the time instant when the deflecting voltage changes, the deflecting voltage is not applied to the deflecting electrodes, and immediately after the lapse of the predetermined period the deflecting voltage is applied to the deflecting electrodes.

7 Claims, 2 Drawing Sheets

APPLIED VOLTAGE ($V_{SRD}$)

CURRENT ($I_{SRD}$)

DEFLECTING VOLTAGE ($V_{SRD1}$)

CURRENT ($I_{SRD1}$)

DEFLECTING VOLTAGE ($V_{SRD1}'$)

DEFLECTING VOLTAGE GENERATING CIRCUIT

BACKGROUND OF THE INVENTION

This invention relates to a deflecting voltage generating circuit for applying a predetermined voltage across the deflecting electrodes of a streak tube or sampling streak tube or the like.

A deflecting voltage generating circuit for applying a predetermined voltage across the deflecting electrodes of a streak tube or sampling streak tube or the like has been well known in the art.

FIG. 4 is a schematic diagram showing the arrangement of a general sampling streak tube. The sampling streak tube 150, as shown in FIG. 4, comprises: a photocathode 131 to which fluorescene is applied; a mesh-shaped electrode 135 for accelerating an electron beam emitted from the photocathode 131; a focusing electrode 136 for focusing the electron beam thus accelerated; an aperture electrode 137; deflecting electrodes 133 for deflecting the electron beam which has been focused by the focusing electrode 136 and passed through the aperture electrode 137, in a sweep mode; a microchannel plate 132 for multiplying the electron beam thus deflected; a sampling electrode 151 for sampling the electron beam thus multiplied; and a phosphor screen 134 to which the electron beam thus sampled is applied.

When, in the sampling streak tube 150, an incident light beam having a constant repetitive frequency is applied to the photocathode 131, the photocathode 131 emits an electron beam corresponding to the intensity of the incident light beam. The electron beam thus emitted is deflected by the deflecting electrodes 133 and sampled with the slit of the sampling electrode 151, as a result of which the parts of the waveform of the incident light beam are successively observed; that is, the variation with time of the waveform of the incident light beam can be detected as a time-series spatial image on the phosphor screen 134.

The deflecting electrodes 131 of the sampling streak tube 150 are connected to a deflecting voltage generating circuit 152. The circuit 152 is provided to apply a predetermined deflecting voltage to the deflecting electrodes 133. The deflecting voltage is trapezoidal in waveform, and is substantially in synchronization with the repetitive frequency of the incident light beam; however, it is gradually shifted in phase so that the parts of the waveform of the incident light beam may be successively sampled.

The deflecting voltage outputted by the deflecting voltage generating circuit 152 must be large in amplitude so that the background noises may not be sampled which are caused by the photoelectrons attributing to light beams scattered by the mesh-shaped accelerating electrode 135 during the period that the electron beam is not deflected. Furthermore, for the purpose of obtaining a high through rate, the drive voltage should be high. In addition, since no sampling operation is carried out inside of the general streak tube, the deflecting voltage must meet not only the above-described requirement that the deflecting voltage should be large in amplitude, but also the requirement that the waveform thereof should linearly rise and fall.

In order to satisfy these requirements; that is, in order to produce a deflecting voltage large in amplitude and excellent in linearity, the conventional deflecting voltage generating circuit 152 employs a switching element such as an avalanche transistor, avalanche diode or triode.

In the case where the deflecting voltage generating circuit 152 is made up of the above-described switching element for the purpose of high speed sweep; that is, it is intended to provide a voltage waveform steep in rise, or high voltage/time ratio (through rate), it is necessary to use a high drive voltage for the switching element, because the switching speed of the switching element is of the order of several nano-seconds. The drive voltage is, for instance, of the order of several kilo-volts (KV). Therefore it is necessary to provide a driving power source for generation of a high drive voltage and its insulated wiring for the conventional deflecting voltage generating circuit 152.

On the other hand, in general, it is desirable to observe an incident light beam with an extremely high repetition frequency (for instance 4 GHz) with a high time resolution of several picoseconds. In the case where such an observation is performed with the above-described streak tube or sampling streak tube, the electron beam sampling repetition frequency must be considerably high. For example, it is necessary that the deflecting voltage generating circuit 152 outputs a defecting voltage having a high repetition frequency (for instance 4 MHz).

However, the switching element such as an avalanche transistor employed in the conventional deflecting voltage generating circuit 152 has a long restoring time after operated and a long charging time for high voltage, so that the deflecting voltage generating repetition frequency is limited, for example, is of the order of 10 KHz in maximum.

In addition, the timing between a trigger signal for starting the switching operation of the above described switching element and the deflection voltage output cannot be electrically adjusted, and therefore it is necessary to additionally provide a delay circuit therefor.

SUMMARY OF THE INVENTION

An object of the invention is to provide a deflecting voltage generating circuit which, even when the drive voltage is low, can obtain a high through rate and can produce a deflecting voltage high in repetition frequency.

The foregoing object of the invention has been achieved by the provision of a deflecting voltage generating circuit, which, according to the invention, comprises: voltage generating means for generating a deflecting voltage; and voltage correcting means for correcting the deflecting voltage generated by the voltage generating means and applying the deflecting voltage thus corrected to deflecting electrodes, the voltage correcting means being so designed that for a predetermined period from the time instant when the deflecting voltage changes, the deflecting voltage is not applied to the deflecting electrodes, and immediately after the lapse of the predetermined period the deflecting voltage is applied to the deflecting electrodes.

In the deflecting voltage generating circuit of the invention, the deflecting voltage produced by the voltage generating means is applied to the voltage correcting means before applied to the deflecting electrodes. In the voltage correcting means, control is so made that, for a predetermined period from the time instant when a deflecting voltage produced by the voltage generating means changes, the deflecting voltage is not applied to the deflecting electrodes, and immediately after the lapse of the predetermined period the deflecting voltage is applied to the deflecting electrodes. Accordingly, if, in the voltage correcting means, the predetermined period is set to the deflecting voltage rise or fall period, then, after the lapse of the predetermined period, the deflecting voltage having a predetermined rise of fall ramp can be applied, as a deflecting voltage extremely steep in rise and fall, to the deflecting electrodes.

DETAILED DESCRIPTION OF THE INVENTION

A preferred embodiment of this invention will be described with reference to the accompanying drawings.

Figure 1:
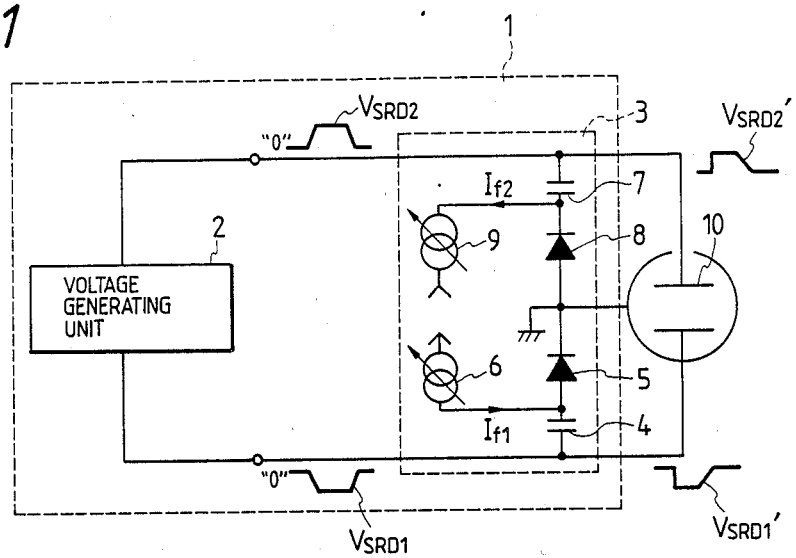
FIG. 1 is a circuit diagram showing the arrangement of one example of a deflecting voltage generating circuit according to this invention.

FIG. 1 is a circuit diagram showing the arrangement of a deflecting voltage generating circuit according to the invention. As shown in FIG. 1, the deflecting voltage generating circuit 1 comprises: a voltage generating unit 2 for generating deflecting Voltages $V_{SRD1}$ and $V_{SRD2}$ which are trapezoidal in waveform similarly as in the case of the conventional deflecting voltage generating circuit 152; and a voltage correcting unit 3 for modifying and correcting the output deflecting voltages $V_{SRD1}$ and $V_{SRD2}$ of the voltage generating unit 2. The deflecting voltages $V_{SRD1}$ and $V_{SRD2}$ are opposite in polarity to each other.

The voltage correcting unit 3 has a capacitor 4, a step recovery diode 5, and a constant current source 6 on its one side receiving the deflecting voltage $V_{SRD1}$, and similarly has a capacitor 7, a step recovery diode 8, and a constant current source 9 on the other side receiving the deflecting voltage $V_{SRD2}$.

The deflecting voltages $V_{SRD1}$ and $V_{SRD2}$ outputted by the voltage generating unit 2 are applied to the voltage correcting unit 3, in which they are corrected into deflecting voltage $V_{SRD1'}$ and $V_{SRD2'}$, respectively. Thereafter, both of the corrected voltages are applied to deflecting electrodes 10.

Figure 2A:
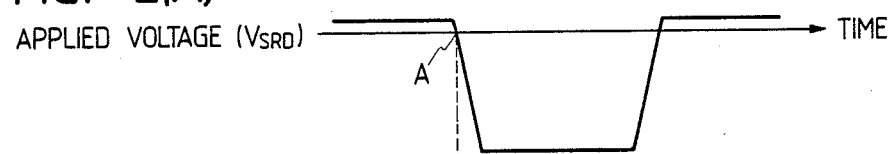
FIGS. 2(A) and 2(B) are time charts showing a voltage $V_{SRD}$ and a Current $I_{SRD}$ applied to a step recovery diode, respectively.

The general characteristics of the step recovery diodes 5 and 8 in the voltage correcting unit 3 will be described with reference to FIGS. 2(A) and 2(B). FIG. 2(A) is a time chart showing the voltage $V_{SRD}$ applied to the step recovery diode, and FIG. 2(B) is a time chart showing the current $I_{SRD}$ flowing in the step recovery diode.

Figure 2B:
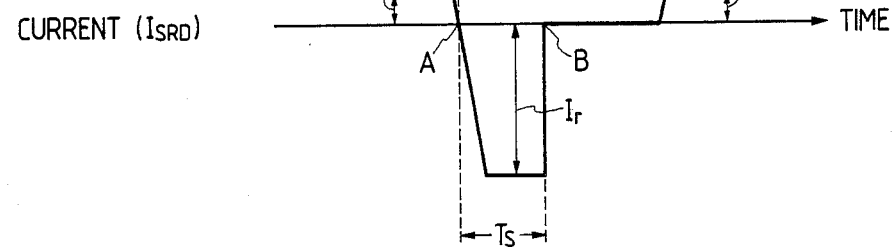

Until the time instant A in FIG. 2(A), a forward voltage is applied to the step recovery diode, while a forward current $I_f$ flows in the step recovery diode as shown in FIG. 2(B). When a reverse voltage is applied to the step recovery diode at the time instant A, a reverse current $I_r$ flows in the step recovery diode for a period of time $T_s$ as shown in FIG. 2(B), and during the period of time $T_s$ the step recovery diode is conductive in the reverse direction. In this case, the step recovery diode is substantially zero in resistance. When compared with the ordinary diode, the step recovery diode is so designed that the period of time $T_s$ for which the step recovery diode is conductive in the reverse direction (hereinafter referred to as "a reversely conductive period $T_s$") is relatively long, and the carriers disappear an extremely short transition time after the lapse of the reversely conductive period $T_s$. Therefore, after the lapse of the reversely conductive period $T_s$, at the time instant B the resistance becomes nearly infinite in an extremely short transition time; that is, the step recovery diode is rendered non conductive. As is apparent from the above description, the step recovery diode will function as a switch which is opened quickly for the period $T_s$ after the reverse voltage is applied thereto. Under the condition that the currents $I_f$ and $I_r$ satisfy $I_f/I_r << 1$, the above-described period $T_s$ can be represented by the following Equation (1):

$$T_s = \tau I_f/I_r \ldots \quad (1)$$

where $\tau$ is the minor carrier life time.

The step recovery diodes 5 and 8 provided in the voltage correcting unit 3 are to perform a high speed switching operation as described above. For this purpose, the voltages $V_{SRD1}$ and $V_{SRD2}$ trapezoid in waveform are applied to the step recovery diodes 5 and 8 in such a manner that the voltages are opposite in polarity to each other.

The operation of the deflecting voltage generating circuit 1 thus organized will be described with reference to time charts shown in the FIGS. 3(A) to 3(C). Since the step recovery diodes 5 and 8 operate in the same manner, only the case where the deflecting voltage $V_{SRD1}$ is applied to the voltage correcting unit 3 will be described.

Figure 3A:
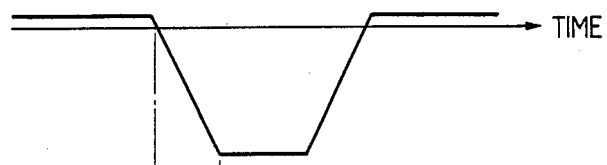
FIGS. 3(A), 3(B) and 3(C) are time charts showing a deflecting voltage $V_{SRD1}$, a current $I_{SRD1}$, and a deflecting voltage $V_{SRD1'}$, respectively.
Figure 3B:
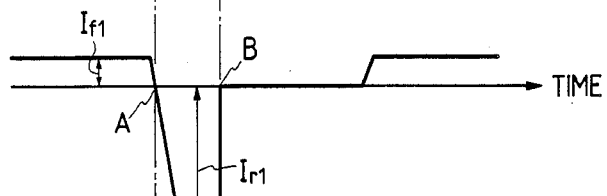

The voltage generating unit 2 of the deflecting voltage generating circuit 1 outputs the deflecting voltage $V_{SRD1}$ trapezoidal in waveform as shown in FIG. 3(A), which is applied to the voltage correcting unit. In the voltage correcting unit 3, the deflecting voltage $V_{SRD1}$ is reversely applied to the step recovery diode 5 through the capacitor 4. As shown in FIG. 3(B), a forward current $I_{f1}$ flows in the step recovery diode 5 until the time instant A when the deflecting voltage $V_{SRD1}$ is reversely applied thereto. When the deflecting voltage $V_{SRD1}$ is applied reversely to the voltage correcting unit 3 at the time instant A, the step recovery diode 5 is rendered conductive for the predetermined period $T_s$ as described above, and a reverse current $I_{r1}$ flows therein. For the period $T_s$, the step recovery diode 5 is maintained conductive, and therefore no voltage is applied to the deflecting electrodes 10. Therefore, if the forward current $I_{f1}$ is adjusted by controlling the current source 6 so that the conductive period $T_s$ of the step recovery diode 5 is equal to the period $T_D$ of fall of the deflecting voltage $V_{SRD1}$ (cf. Equation (1)), then no voltage is applied to the deflecting electrodes 10 for the period of fall of the deflecting voltage $V_{SRD1}$. After the conductive period $T_s$, at the time instant B the step recovery diode 5 becomes non-conductive quickly as shown in FIG. 3(B). Thus, after the time instant B, the deflecting voltage $V_{SRD1}$ is applied to the deflecting electrodes 10.

Figure 3C:
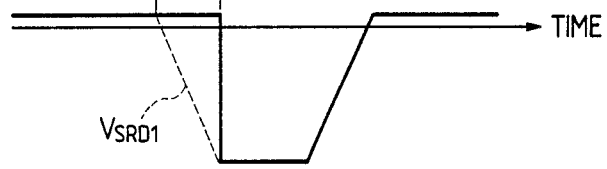
Figure 4:
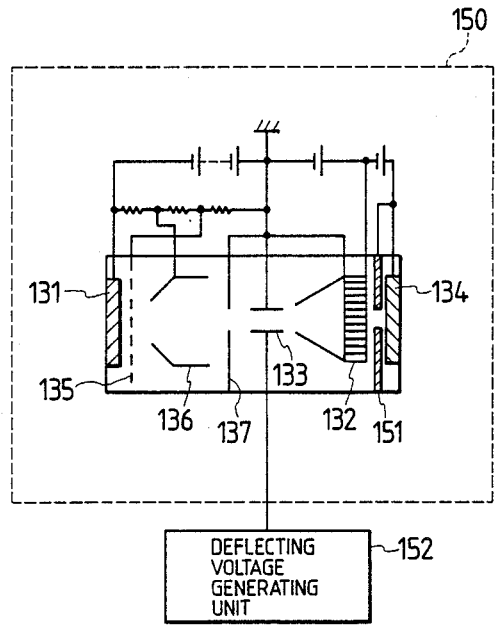
FIG. 4 is an schematic diagram showing the arrangement of the conventional sampling streak tube.

FIG. 3(C) shows the deflecting voltage $V_{SRD1'}$ into which the deflecting voltage $V_{SRD1}$ has been converted in the voltage correcting unit and which is applied to the deflecting electrodes 10. As is apparent from FIG. 3(C), the fall of the deflecting voltage $V_{SRD1'}$ applied to the deflecting electrodes 10 is much steeper than that of the deflecting voltage $V_{SRD1}$. That is, the voltage/time ratio (through rate) of the deflecting voltage $V_{SRD1'}$ is about ten times as high as that of the deflecting voltage $V_{SRD1}$ provided with the conventional switching element. As a result, even when the drive voltage is much lower than that in the conventional deflecting voltage generating circuit, the through rate obtained is substantially equal to that of the deflecting voltage provided by the conventional deflecting voltage generating circuit, and the electron beam in the sampling streak tube or streak tube can be deflected at considerably high speed.

Since the step recovery diode 5 can give a high through rate with a low drive voltage applied thereto and therefore, upon suspension of the application of the reverse voltage, the step recovery diode 5 can be restored quickly, the deflecting voltage $V_{SRD1'}$ to be applied to the deflecting electrodes 10 can be produced with a high repetitive frequency of 4 MHz or higher. Thus, with the streak tube or sampling streak tube, the sampling operation can be carried out with a high repetitive frequency of 4 MHz or higher.

The current source 6 can be controlled so as to change the forward current $I_{f1}$ of the step recovery diode 5 and adjust the reversely conductive period $T_s$ according to the Equation (1). Therefore, the timing of fall Of the deflecting voltage $V_{SRD1'}$ can be readily adjusted. That is, although the conventional voltage generating circuit uses the delay circuit for adjusting the timing of the deflecting voltage, in the embodiment of the invention the timing adjusting can be achieved electrically with ease. Furthermore, when the forward Current $I_{f1}$ of the step recovery diode is adjusted to be zero, the voltage correcting unit 3 may be electrically disconnected from the deflecting voltage generating circuit 1 so that the deflecting voltage $V_{SRD1}$ provided by the voltage generating unit 2 can be directly applied to the deflecting electrodes 10. Therefore, a deflecting voltage slow in fall can be applied to the deflecting electrode 10. This means that one circuit can provide a wide range of voltages from a low speed deflecting voltage to a high speed deflecting voltage.

As described above, according to the invention, for the predetermined period from the time instant when the deflecting voltage generated by the voltage generating means changes, the deflecting voltage is not applied to the deflecting electrodes, and immediately after the lapse of the predetermined period the deflecting voltage is applied to the deflecting voltages. Therefore, a deflecting voltage substantially high in rise time or fall time can be applied to the deflecting electrodes, so that even if the deflecting voltage generating drive voltage is low in the voltage generating means, a deflecting voltage high both in through rate and in repetitive frequency can be applied to the deflecting electrodes. In the voltage correcting means, the step recovery diode is allowed to perform the above-described operation, and the forward current of the step recovery diode is adjusted by controlling the constant current source, thereby to change the above-described predetermined period, so that the timing of the deflecting voltage with the trigger signal can be readily adjusted. In addition, the high speed deflecting voltage can be switched over to the low speed deflecting voltage by adjusting the forward current flowing in the step recovery diode to be zero.

What is claimed is:

1. A deflecting voltage generating circuit for generating a deflecting voltage comprising:
   voltage generating means for generating a deflecting voltage; and
   voltage correcting means for correcting and shaping said deflecting voltage generated by said voltage generating means to have a greater slope and applying said deflecting voltage thus corrected to deflecting electrodes,
   said voltage correcting means preventing application of said deflecting voltage to said deflecting electrodes for a predetermined period from the time instant when said deflecting voltage changes and applying said deflecting voltage to said deflecting electrodes immediately after the lapse of said predetermined period.

2. A deflecting voltage generating circuit as claimed in claim 1, wherein said voltage correcting means comprises a pair of step recovery diodes, each of said step recovery diodes being arranged so that said deflecting voltage is applied thereto in the reverse direction.

3. A deflecting voltage generating circuit as claimed in claim 2, wherein each of said step recovery diodes is rendered conductive for a predetermined period from the time instant when said deflecting voltage is applied thereto in the reverse direction, and is rendered nonconductive immediately after the lapse of said predetermined period.

4. A deflecting voltage generating circuit as claimed in claim 3, wherein said voltage correcting means further comprises a pair of current sources for adjusting the forward currents of said step recovery diodes.

5. A deflecting voltage generating circuit as claimed in claim 4, wherein said voltage correcting means further comprises a pair of capacitors, each of said capacitors being provided between said step recovery diodes and an input terminal of said voltage correcting means for receiving said deflecting voltage from said voltage generating means.

6. A deflecting voltage generating circuit for generating a deflecting voltage comprising:
   voltage generating means for generating a deflecting voltage; and
   voltage correcting means for correcting and shaping said deflecting voltage generated by said voltage generating means to have a greater slope and applying said deflecting voltage thus corrected to deflecting electrodes,
   said voltage correcting means preventing application of said deflecting voltage to said deflecting electrodes for a predetermined period from the time instant when said deflecting voltage changes and applying said deflecting voltage to said deflecting electrodes immediately after the lapse of said predetermined period, said voltage correcting means including a pair of step recovery diodes.

7. A deflecting voltage generating circuit as claimed in claim 6, wherein said voltage correcting means further comprises a pair of current sources for adjusting the forward currents of said step recovery diodes.

* * * * *